(12) United States Patent
Scheibenzuber et al.

(10) Patent No.: US 9,541,600 B2
(45) Date of Patent: Jan. 10, 2017

(54) METHOD FOR POSITIONING A CARRIER WITH A PLURALITY OF ELECTRONIC COMPONENTS IN A DEVICE FOR TESTING THE ELECTRONIC COMPONENTS

(71) Applicant: Multitest elektronische Systeme GmbH, Rosenheim (DE)

(72) Inventors: Helmut Scheibenzuber, Weyarn (DE); Andreas Bursian, Raubling (DE); Bernhard Lorenz, Marzling (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 135 days.

(21) Appl. No.: 14/559,736

(22) Filed: Dec. 3, 2014

(65) Prior Publication Data

US 2015/0160292 A1 Jun. 11, 2015

(30) Foreign Application Priority Data

Dec. 5, 2013 (DE) .................. 10 2013 113 580

(51) Int. Cl.
*G01R 31/28* (2006.01)
(52) U.S. Cl.
CPC ................. *G01R 31/2867* (2013.01)
(58) Field of Classification Search
None
See application file for complete search history.

(56) References Cited

U.S. PATENT DOCUMENTS

| | | | | |
|---|---|---|---|---|
| 6,111,421 A | * | 8/2000 | Takahashi | G01R 31/2868 324/750.04 |
| 6,124,725 A | * | 9/2000 | Sato | G01R 31/2851 324/754.03 |
| 2006/0290369 A1 | | 12/2006 | Yamashita et al. | |
| 2011/0018564 A1 | | 1/2011 | Washio et al. | |

* cited by examiner

*Primary Examiner* — Paresh Patel
(74) *Attorney, Agent, or Firm* — Lewis Roca Rothgerber Christie LLP

(57) ABSTRACT

Embodiments of the invention are based on a method for positioning a carrier with a plurality of electronic components in a device for testing the electronic components, wherein the carrier is provided with a pick-and-place unit. According to embodiments of the invention
- several markings at one side of the carrier are detected with at least one camera and the position of the markings is determined in relation to the known position of a nest for receiving the carrier,
- the nest is moved into a position exactly opposite to the carrier,
- the carrier is handed over to the nest,
- several further markings at the other side of the carrier are detected by at least one further camera and the position of the further markings is determined in relation to the determined position of a test socket,
- the nest is positioned in a position exactly opposite to the test socket and the carrier is pressed against the test socket.

8 Claims, 2 Drawing Sheets

Figure 1:
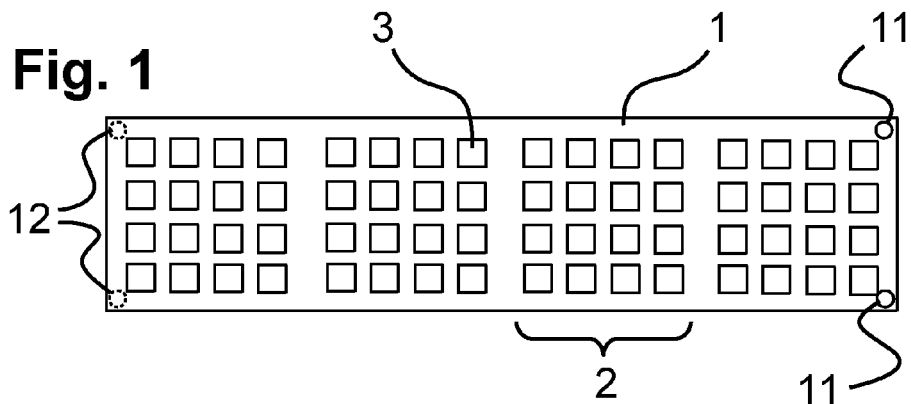

METHOD FOR POSITIONING A CARRIER WITH A PLURALITY OF ELECTRONIC COMPONENTS IN A DEVICE FOR TESTING THE ELECTRONIC COMPONENTS

This application claims the benefit of the filing date of German Patent Application No. 10 2013 113 580.3 filed 5 Dec. 2013, the disclosure of which is hereby incorporated herein by reference.

FIELD OF THE INVENTION

Embodiments of the invention relates to a method for positioning a carrier with a plurality electronic components in a device for testing the electronic components.

TECHNOLOGICAL BACKGROUND

In order to save space on printed circuit boards the level of integration of electronic components should be raised further and further. To this end some components are now beginning to be stacked vertically and connected three-dimensionally to form so-called 3D-ICs. The vertical connection of individual components is preferably realized in TSV technology (Through-Silicone-Via). Using TSV technology the connection between individual horizontal layers is effected by vertical metallic connections with a diameter of up to approx. 5 μm. These 3D-TSV-ICs are characterized by a high level of integration relative to their footprint and behave extremely robustly.

As such a 3D-integrated circuit (3D-IC) is a circuit which consists of a vertical stack of thinned individual chips. Seen from outside the circuit looks like a monolithic circuit, but strictly speaking is more like a hybrid circuit, but with a higher level of integration than typical hybrid circuits. The aim of 3D-integration is to achieve a still higher functionality of the ICs for a same-size footprint of the housing. Individual chip planes in the 3D-ICs are connected using through-contacting with the aid of TSVs. TSV, at the moment, represents the best available technology for realizing the high demands for the electric paths (short, robust, etc.).

The increased rejection rate which is due to the high level of integration can be minimized in that testing is carried out not only on the finished ICs and the individual components, but also on the stack whenever a new component is added to the existing stack and through-contacted.

US 2006/0290369 A1 discloses an electronic device testing unit for testing IC chips by means of pressing their input/output connections against contact units of a test head. The electronic device testing unit is provided in the form of a test plate with test plate body. The test plate comprises holders for holding the rear surfaces of IC chips, which surfaces do not comprise any protruding input/output connections, but which surfaces are essentially smooth holding surfaces. During the time of testing the holders are held on the test plate body in a swingable manner. The side surfaces of the holders are guided by means of guide surfaces, which are provided in the vicinity of the contact units. The IC chips are held by means of the holders.

US 2011/0018564 A1 discloses a wafer prober, which is provided with a storage space, one or more alignment units, contact units and a storage transport section. The storage space supports a wafer at a certain position, transports it to a further processing position of the wafer and is located at the further processing position. One or more alignment units position the wafer at a certain position relative to the storage space. The contact units are arranged in a number which is greater than that of the alignment units and they carry out an examination further processing in contact with the wafer at the further processing position. A storage space section transports the wafer between the alignment unit and the contact unit. The storage space is provided with three or more pin holes, an alignment marking and an alignment section.

This results in that many defects can be recognized at a very early stage of manufacture and can possibly even be repaired. Should one of the required components found to be defective, there is then no need to remove the finished module, but the defective component can be replaced before assembly by a component which has been tested and found to be OK.

Normally the ICs are held on the substrate until they are finished and it is only then that they are singularized by sawing the substrate. Intermediate tests prior to completion of the individual ICs are therefore normally carried out on the substrate.

There is however also the possibility via TSV to connect a processor module with e.g. a separately manufactured storage module. Therefore, one of the components may already have been singularized before it is tested. Testing of already singularized components is carried out in carriers, on which a larger number of components may have been fixed in their exact positions. In the following therefore the word "carrier" is used, independently of whether the components are components on a substrate or already singularized components on a carrier. Similarly, wafer or parts thereof are to be regarded as components not yet separated.

With components of this kind on a carrier, for example a processor on a substrate, which is to be connected via TSVs with a further component configured as a storage, contacts are provided on the substrate opposite to the component, and on that side which is to be connected with the further component. A reliable test can only be carried out if both kinds of contact can be contacted simultaneously.

In order to make an accurate association between the contacts of the electronic component and the test contacts, it has previously been sufficient to center the components mechanically. In view of the small distance, however, in particular of the contacts on the side of the electronic component, at which side a further component is to be connected, this is no longer sufficient. Mechanical centering comprises tolerances which are partly larger than the distances between individual contacts. Therefore errors during testing are unavoidable.

SUMMARY OF THE INVENTION

The may be a need to improve a method for positioning a carrier with a plurality of electronic components in a device for testing the electronic components in such a way that the carrier can be positioned such that the contacts on both sides of the component can be unequivocally associated with the contacts of the test device.

According to an embodiment of the invention a method for positioning a carrier with a plurality of electronic components in a device for testing the electronic components, with the features of claim 1 is provided. Due to the detecting of several markings at one side of the carrier with at least one camera and the determining of the position of the markings in relation to the known position of a nest for receiving the carrier, the moving of the nest into a position exactly opposite to the carrier, the transfer of the carrier to the nest, the detection of several further markings at the other side of the carrier with at least one further camera and determination of the position of the further markings in relation to the fixed position of a test socket as well as the positioning of the nest into a position exactly opposite to the test socket and the pressing of the carrier against the test socket, the accuracy of double sided contacting of several electronic components on a carrier can be vastly increased.

Exactly measuring of the position of a marking with the aid of a camera can be solved using existing means. Furthermore, highly precise drives are known which ensure both an accurate linear movement and an accurate pivotal movement. Due to the combination of the method steps according to embodiments of the invention this is the first time that the desired contacting accuracy is achieved using known means.

Further details and advantages of embodiments of the invention are revealed in the sub-claims. Embodiments of the invention are explained here mainly with reference to 3D-TSV-ICs, but is, of course, applicable also to e.g. package-on-package ICs (POP).

Normally the carriers are held in the nest by suction cups subjected to a negative pressure. When at first the test contacts of the nest are positioned, the force applied upon the carrier from this side is substantially higher than that of the suction cups from the other side. This would cause the carrier, which has been accurately positioned on the nest, to detach itself or at least to be displaced. Also it could result in the carrier becoming deflected which could lead to a damage of the contacts. Therefore, the electronic components are firstly contacted by test needles of the test socket and not till then they are contacted by the test contacts of the nest.

The contacts of all electronic components to be tested are connected with the test head of the test device via a load board. In order to keep the complexity and the size of the load board within what is technically achievable, the number of electronic components to be simultaneously tested is therefore limited. Therefore, in a first test step only one group of electronic components on the carrier is tested.

In consequence, the test socket is configured in such a manner that it provides only the corresponding number of test needles, which is needed for the group of electronic components, which is supposed to be simultaneously tested. Therefore, as only the group to be tested is contacted by the test needles of the test socket, the pressure applied to the carrier via the test socket is also limited to the group currently to be tested. In order to prevent the remaining part of the carrier from lifting off the nest, only the group to be tested is contacted by the test contacts of the nest.

After the test procedure of one group of electronic components on the carrier has been completed, the previous steps have to be repeated in reverse order so as to prevent the same disadvantages as already described from occurring. Therefore, after testing one group firstly the contact to the test contacts of the nest and then , followed by breaking the contact to the test needles of the test socket may be broken.

In other words, according to an exemplary embodiment, in the position of the nest exactly opposite the carrier, the electronic components are contacted with test contacts of the nest from the side of the carrier and, in the position of the nest exactly opposite to the test socket, the electronic components are contacted with test needles of the test socket from the other side of the carrier.

The respective sides (e.g. topside and underside) of the carrier, on which markings are provided, are formed on the carrier so as to be formed opposite to each other. Further, the sides of the carrier may e.g. be configured so as to extend in parallel to each other.

The electronic components can be contacted by test needles of the test sockets on one side of the carrier and by test contacts of the nest on the other side of the carrier. This allows opposite sides (e.g. topside and underside) of the components also to be contacted. The electronic components to be tested comprise contactable contacts both on the one side (topside) and on the opposite side (underside). The one side and the other side are designed so as to extend in parallel to each other, forming mutually opposite sides. The one side (e.g. the topside of the component) and the other side (e.g. the underside of the component) are the two sides of the electronic component which comprise the greater extension, respectively, in a plane which is defined by two directions at right angles to each other, of the electronic component. The electronic components can thus be contacted (e.g. simultaneously) from both sides.

Since the test socket has contacts only for one group of electronic components on a carrier and is itself mounted at a fixed location, the nest has to be moved into a new position once the first group has been tested. Repositioning of the nest is possible without problems given the high precision drives because the previous position and, via the known position of the next group, also the new position of the nest are known. Therefore, the nest is advantageously moved into a position relative to the test socket, in which the test needles of the test socket are positioned exactly above a further group of electronic components on the carrier.

In order to be able to adapt the position of the nest at first at the carrier being provided and then to be able the position of the test socket, various high precision drives must be provided. The nest may be movable in two directions perpendicular to each other and pivotable about an axis which extends vertically to the two directions of movement. In this respect the assumption is made that the carrier is always kept ready in a position parallel to a predefined plane.

DETAILED DESCRIPTION OF EXEMPLARY EMBODIMENTS

Figure 2:
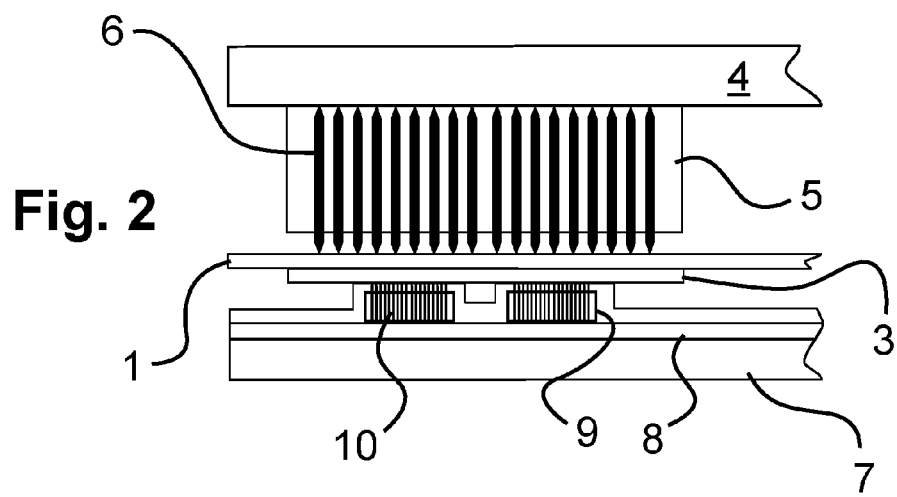
Figure 3:
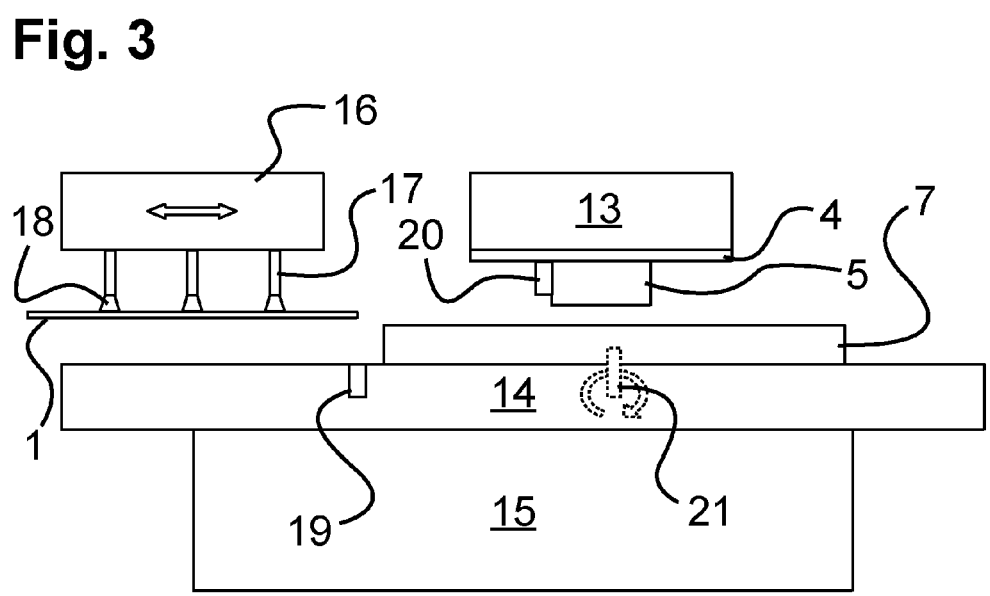
Figure 4:
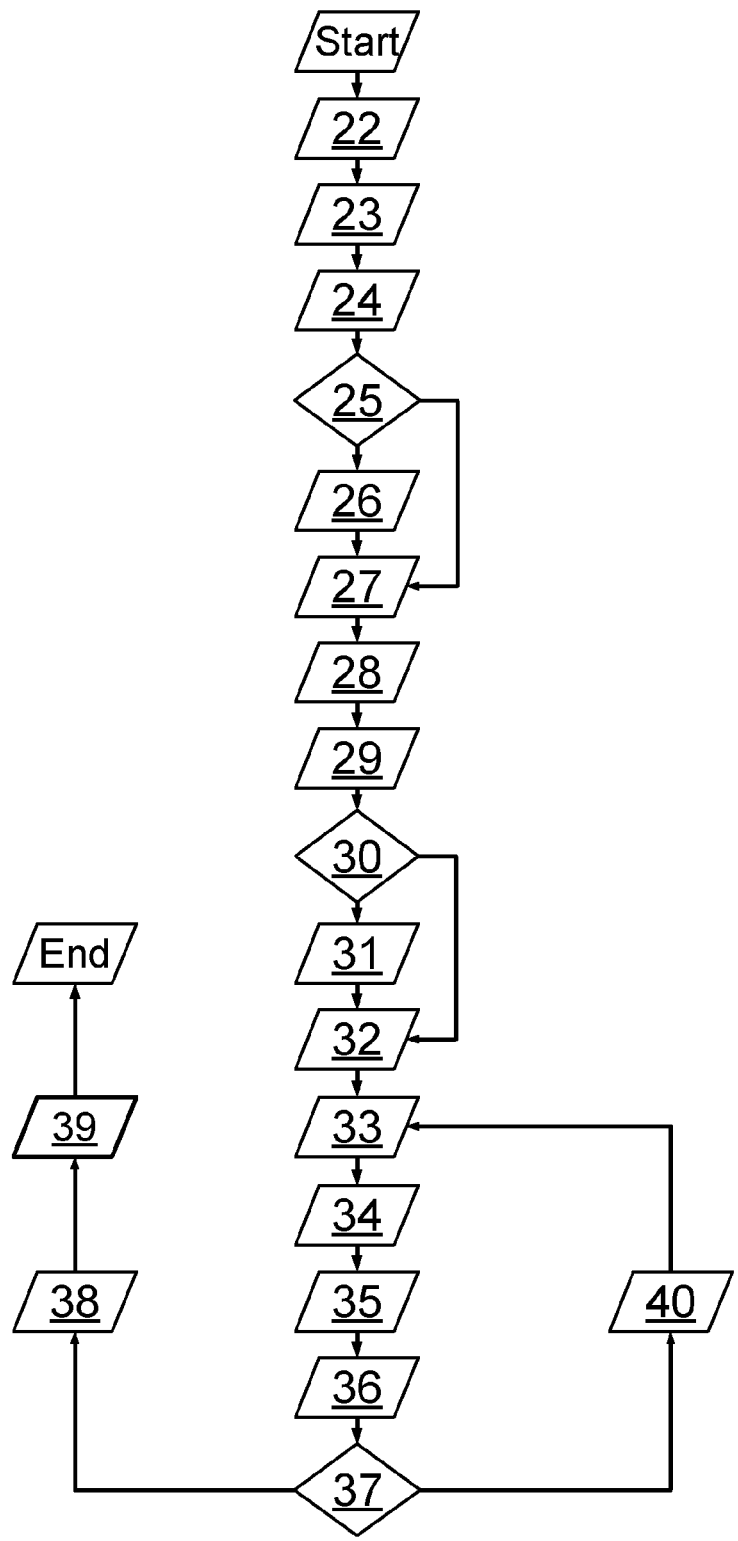

Further details and advantages of embodiments of the invention are revealed in the description of an exemplary embodiment which will now be explained in detail with reference to the drawing, in which FIG. 1 shows a view upon the underside of a substrate with electronic components, FIG. 2 shows a schematic view of a test device, FIG. 3 shows a schematic view of an exemplary embodiment of a test device for carrying out the described method, and FIG. 4 shows a flow diagram of an exemplary embodiment of the described method.

Embodiments of the invention will now be described with reference to a test device for a substrate with electronic components. However, with the described test device it is also suitable for testing individual electronic components which have been placed and fixed on a so-called carrier. The carrier must be configured for testing in such a way that the components mounted on it can be contacted both from above and from below. Further embodiments of the invention can also be applied to wafer or parts thereof. It is unimportant whether the wafer itself acts as a carrier or whether the wafer is supported by an independent carrier.

The underside of the substrate 1 shown in FIG. 1 comprises 64 electronic components 3 which are to be connected using TSV technology with at least one other kind of electronic component. The electronic components 3 are assembled to form four groups 2 with 16 components 3 each.

The contacts via which each module is addressed following its completion are to be found, here not visible, on the rear of the substrate 1. On the side of the electronic components 3 shown here there are the contacts, via which the electronic component shall be connected with at least one further component. These contacts, however, are so tiny and are present in such a large number (>1000) that it is impossible to represent them here. It is also possible that these bond points have their own associated test contacts in the edge region of the component so that during a testing there is no need for contacting these very sensitive bond points.

There are two markings 11 at the underside of the substrate 1 which comprise a firm reference for the bond points of the electronic components 3. On the other hand on the non-visible topside of the substrate 1 there are markings 12 (shown as broken lines) arranged, which comprise a fixed for the contacts via which each electronic module once completed can be addressed. In this respect it has to be s pointed out that the markings were in fact created as highly accurate reference points for the contacts but not as reference points for the substrate 1, such as for corners or edges of the substrate 1.

In the upper region of FIG. 2 a normally used test device is shown. With the so-called load board 4 a test socket 5 with its test contacts 6 is coupled. The load board 4 establishes the connection between the test socket 5 and the test head not shown here. All signals between the contacts of the electronic components 3 currently being tested on the topside of the substrate 1 and the test head are transmitted via the load board 4.

The substrate 1 with its electronic components 3 is located in a nest 7, in which it is very accurately positioned and fixed. An interface is provided within the nest, of which here a nest socket 9 with test contacts 10 of the nest socket 9 and a nest board 8 are shown. The nest socket 9 shown here is drawn like a normal test socket, but is advantageously manufactured in MEMS technology. With this technology it is possible for providing the required fine structures.

FIG. 3 schematically shows the construction of the test device as a whole. The substrate 1 with the electronic components 3 to be tested is passed to the test device by a pick-and-place unit 16. The pick-and-place unit 16 comprises extendable and retractable plungers 17 with suction cups 18 attached to it. The substrate 1 is retained by the suction cups 18 with negative pressure. In an embodiment not shown here the pick-and-place unit 16 may alternatively be equipped with claws which fix the substrate in a positive-locking manner. The pick-and-place unit 16 is movable in direction of the double arrow, wherein the accuracy of the drive is not of paramount importance.

The test device as such comprises the following stationary mounted components: the test head 13 (shown in FIG. 3), the load board 4, the test socket 5 and two upper cameras 20, wherein the second upper camera is in an invisible position behind the visible upper camera. The functions of individual components will be discussed later in greater detail.

The nest 7 with the nest socket 9 not shown here is located below the test socket 5. The nest 7 can be moved by means of the high-precision X-Y carriage 14 in two directions of the plane defined by the substrate 1. In order to be able to also correct a twisting of the substrate 1 about the Z-axis of the substrate plane, the nest is additionally equipped with a highly accurate rotary drive for a rotation about the rotary axis 21 indicated as a broken line. Via the rotary axis 21 the nest 7 is connected to the X-Y carriage 14. The two lower cameras 19 also arranged one behind the other are attached to the frame not movable together with the X-Y carriage 14, and these move only together with a lifting post 15 in direction of the Z-axis and in other respects are stationary.

The lifting post 15 is located below the X-Y carriage 14 and the nest 7. The lifting post 15 is used in order to press the nest together with the substrate against the test socket.

The method will now be described. In a first step 22 the pick-and-place device 16 picks up the substrate 1 with the suction cups 18 at a point not shown and transports it in direction of the test socket 5. In this context the drive for the pick-and-place device 16 does not need to exceed typical requirements making it possible to use low-cost drive units. At this point in time the lifting post 15 is in a position, in which the underside of the substrate 1 forms the focal point for the lower camera 19. The pick-and-place device 16 is moved to a predefined position in which it is ensured that the lower cameras 19 which are stationary in X-Y direction can detect the markings 11 on the underside of the substrate 1.

In a second step 23 the markings 11 on the underside of the substrate 1 are detected by both cameras 19. Via a computer not shown, which is connected to the lower cameras 19, the positional difference of the markings 11 with respect to predetermined required positions is determined.

In a third step 24 the nest 7 is then moved via the high-precision drives of the X-Y carriage 14 to a predetermined position in which the substrate could be picked up if the markings 11 on the underside of the substrate 1 were in the required position. Therefore a check is carried out in step 25, whether there is a difference between the required position and the measured position. If no difference has been determined, the method proceeds to step 27.

Since as a rule there will, however, be such a difference, the nest 7 will, in most cases, be moved in the next step 26 merely by the determined positional difference. A linear positional difference can be compensated for by the X-Y drive 14. If in addition the substrate is to be held in a rotated position by the pick-and-place device 16, the nest 7 can be adapted to this position also by a rotation via the rotary axis 21.

Thereafter the nest 7 is exactly located below the substrate 1 allowing it, in step 27, to be deposited accurately above the nest socket 9 by extending the plungers 17 and switching off the suction cups 18. In this position the substrate 1 is focused on the nest 7 without the test contacts 10 of the nest socket 9 having yet established the connection to the electronic components 3 on the substrate 1. The pick-and-place device 16 is then moved to the left out of the range of the test socket 5.

Next the nest 7 must be moved with the substrate 1 in such a way that the contact points on the topside of the substrate 1 coincide exactly with the test needles 6 of the test socket 5. In the next step 28 the nest 7 therefore moves into a predefined required position in which it is ensured that the markings 12 on the topside of the substrate 1 can be detected by the stationary upper cameras 20 on the test socket 5.

In step 29 the markings 12 on the topside of the substrate are detected by the two upper cameras 20. The computer also connected to the upper cameras 20 again determines a positional difference between the measured positions of the markings 12 and predefined required positions of the markings 12. These required positions apply to a position in which the contacts on the topside of the substrate lie directly below the corresponding test needles 6 of the test socket 5. It must now be determined again in step 30, whether there is a positional difference. Should no difference be detected between the required position and the measured position of the markings 12, the process can continue with step 32.

Otherwise the nest 7 is moved in step 31 by the determined positional difference. This is again carried out by the high-precision drives of the X-Y carriage 14 and the rotary drive.

When the contacts on the topside of the substrate 1 are now exactly below the test needles 6 of the test socket 5, the lifting post 15 is activated in step 32 and the nest 7 is moved upwards on the Z-axis until the test needles 6 of the test socket 5 are pressed with a predetermined force against the contacts on the topside of the substrate 1.

It is not until now that in step 33 the test contacts 10 of the nest socket 9 can be pressed against the contacts of the electronic components 3 on the underside of the substrate 1. Due to the small distances between the contacts of the electronic components 3 on the underside of the substrate 1 and the very small contact surfaces, a deflection of the substrate 1 during a touch-down of the test contacts 10, for example, would have the effect of the test contacts damaging the components during a movement on the contacts or of negatively affecting the positional association. Therefore, the nest 7 is pressed first against the test needles 6 of the test socket 5 so that the individual electric components are pressed downwards and the substrate is fixed in the nest at great force. Not until then a counter pressure is built up by the test contacts 10 of the nest 9, which is however neither able to separate the substrate 1 from the nest 7 nor to deflect the substrate 1. Therefore, only those components are contacted by the nest socket 9 which have already been contacted by the test socket 5.

Even though it is possible for the nest socket 9 to simultaneously contact all components 3 of the substrate 1, for the above mentioned reasons only those components are contacted with each test step, which have also been contacted by the test socket 5. With the substrate 1 shown in FIG. 1 first the left-hand group 2 of 16 electronic components 3 is for example contacted by the test socket 5. Only after the lifting post 15 has been moved into the contact position and pressure is applied by the test socket 5 onto the group 2 of electronic components 3 to be tested and thus also onto the substrate 1, the test contacts 10 of the nest socket 9 are brought into contacting position. In step 34 the first test step is then carried out for testing the first group 2 of electronic components 3.

Following the test the process proceeds in reverse direction. Firstly, in step 35, the contact between the test contacts 10 of the nest socket 9 and the contacts on the underside of the electronic components 3 is broken. Not till then, in step 36, the lifting post 15 is moved downwards so that the contacts on the topside of the substrate 1 detach themselves from the test needles 6 of the test socket 5.

Then, in step 37, a check must be carried out, whether the already tested group 2 of electronic components 3 was the last group on the substrate 1 to be tested. If this is the case the substrate in step 38 must be passed again to the pick-and-place device 16 and put down by the same. To this end the pick-and-place device 16 moves again into the position shown in FIG. 3 and the nest 7 is moved under the suction cups 17. The plungers 17 are moved downwards, until they hit the substrate 1. Then the suction cups 18 build up negative pressure, and the plungers 17 are again retracted.

Thereafter, in step 39, the pick-and-place device 16 moves to the left and deposits the tested substrate 1 in a manner not shown in detail.

However, if the group 2 of electronic components 3 on the substrate 1 just tested is not the last group to be tested, the next group 2 on the substrate 1 must be tested. To this end, in step 40, the nest 7 moves into a position, in which the next group 2 of electronic components 3 is accurately positioned with its contacts below the test needles 6 of the test socket. Thereupon, the second group undergoes the same testing in steps 33 to 37 as has already been described for the first group.

Following the test of the last group 2 of electronic components 3 the nest 7 moves into a position, in which the substrate 1 can be handed back to the pick-and-place device 16. The pick-and-place device 16 again deposits the substrate 1 at a place not shown here and presents the next substrate for take-over by the nest 7.

List of Reference Symbols 1 substrate
2 group of electronic components 3 to be tested
3 electronic component
4 load board
5 test socket
6 test needles of the test socket
7 nest
8 nest board
9 nest socket
10 test contacts of the nest socket
11 markings on the underside of the substrate
12 markings on the topside of the substrate
13 test head
14 X-Y-carriage
15 lifting post
16 pick-and-place device
17 plunger
18 suction cup
19 lower cameras
20 upper cameras
21 rotary axis of the nest
22 positioning of the substrate by the pick-and-place device
23 determining the positions of the markings on the underside of the substrate
24 moving the nest into the predefined required position
25 checking whether the positions of the test socket and the substrate match
26 adapting the position of the substrate to match the position of the test socket
27 depositing the substrate in the nest
28 moving the nest into the predefined required position
29 determining the positions of the markings on the topside of the substrate
30 checking whether the positions of the test socket and the substrate match
31 adapting the position of the substrate to match the position of the test socket
32 pressing the nest against the test socket
33 contacting a part of the nest socket with the electronic components
34 test
35 breaking the contact between the nest socket and the electronic components
36 breaking the contact between the test socket and the substrate by lowering the lifting post 37 deciding whether further groups on the substrate are to be tested
38 Handing the substrate over to the pick-and-place device
39 depositing the tested substrate
40 moving the nest into a position in which the next group of electronic components can be tested

The invention claimed is:

1. A method for positioning a carrier with a plurality of electronic components in a device for testing the electronic components, wherein the carrier is provided with a pick-and-place unit, characterized in that
several markings at one side of the carrier are detected with at least one camera and the position of the markings is determined in relation to the known position of a nest for receiving the carrier,
the nest is moved into a position exactly opposite to the carrier,
the carrier is handed over to the nest,
several further markings at the other side of the carrier are detected by at least one further camera and the position of the further markings is determined in relation to the determined position of a test socket,
the nest is positioned into a position exactly opposite the test socket and the carrier is pressed against the test socket.

2. The method according to claim 1, characterized in that the electronic components are first contacted by test needles of the test socket and thereafter by test contacts of the nest.

3. The method according to claim 1, characterized in that in the position of the nest exactly opposite to the carrier the electronic components are contacted from the side of the carrier with test contacts of the nest and in that in the position of the nest exactly opposite the test socket the electronic components are contacted from the other side of the carrier with test needles of the test socket.

4. The method according to claim 1, characterized in that in a first test step only one group of electronic components of the carrier is tested.

5. The method according to claim 4, characterized in that only the group to be tested is contacted by the test needles of the test socket and by the test contacts of the nest.

6. The method according to claim 4, characterized in that following the test of one group first the contact with the test contacts of the nest is broken, and then the contact with the test needles of the test socket is broken.

7. The method according to claim 4, characterized in that the nest is moved into a position opposite to the test socket, in which the test needles of the test socket are positioned exactly above a further group of electronic components on the carrier.

8. The method according to claim 1, characterized in that the nest can be moved in two directions perpendicular to each other and pivoted about an axis vertical to the two directions of movement.

* * * * *